United States Patent
Mikawa et al.

(10) Patent No.: US 11,961,651 B2
(45) Date of Patent: Apr. 16, 2024

(54) COIL DEVICE, PHASE SHIFT CIRCUIT, AND COMMUNICATION APPARATUS

(71) Applicant: Murata Manufacturing Co., Ltd., Nagaokakyo (JP)

(72) Inventors: Kentaro Mikawa, Nagaokakyo (JP); Hideaki Kobayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 384 days.

(21) Appl. No.: 17/368,903

(22) Filed: Jul. 7, 2021

(65) Prior Publication Data

US 2021/0335533 A1 Oct. 28, 2021

Related U.S. Application Data

(63) Continuation of application No. PCT/JP2020/005091, filed on Feb. 10, 2020.

(30) Foreign Application Priority Data

Feb. 22, 2019 (JP) ................. 2019-030411

(51) Int. Cl.
*H01F 27/28* (2006.01)
*H01F 27/29* (2006.01)
(Continued)

(52) U.S. Cl.
CPC ......... *H01F 27/2804* (2013.01); *H01F 27/29* (2013.01); *H03H 7/18* (2013.01); *H04B 1/40* (2013.01); *H01F 2027/2809* (2013.01)

(58) Field of Classification Search
CPC .. H01F 27/28; H01F 27/2804; H01F 27/2823; H01F 27/2828; H01F 27/29;
(Continued)

(56) References Cited

U.S. PATENT DOCUMENTS 7,990,247 B2 * 8/2011 Meinke ..................... H01F 7/20
336/224
8,896,406 B2 * 11/2014 Yamamoto .......... H01F 27/2847
336/200
(Continued)

FOREIGN PATENT DOCUMENTS

JP   03-153011 A    7/1991
JP   2016-219606 A  12/2016
(Continued)

OTHER PUBLICATIONS

Official Communication issued in International Patent Application No. PCT/JP2020/005091, dated Apr. 21, 2020.

*Primary Examiner* — Quochien B Vuong
(74) *Attorney, Agent, or Firm* — Keating & Bennett, LLP

(57) ABSTRACT

In a coil device, a first coil includes a common terminal side first coil conductor connected to a ground terminal, an intermediate first coil conductor, and an input/output terminal side first coil conductor connected to a first input/output terminal, and a second coil includes a common terminal side second coil conductor connected to the ground terminal, an intermediate second coil conductor, and an input/output terminal side second coil conductor connected to a second input/output terminal. The input/output terminal side first coil conductor is located between the intermediate second coil conductor and the input/output terminal side second coil conductor, and the input/output terminal side second coil conductor is located between the intermediate first coil conductor and the input/output terminal side first coil conductor.

20 Claims, 9 Drawing Sheets

(51) Int. Cl.
*H03H 7/18* (2006.01)
*H04B 1/40* (2015.01)

(58) Field of Classification Search
CPC ... H04B 1/38; H04B 1/40; H03H 7/18; H03H 7/20

See application file for complete search history.

(56) References Cited

U.S. PATENT DOCUMENTS

| | | | |
|---|---|---|---|
| 10,348,265 B2* | 7/2019 | Ishizuka | H03H 7/19 |
| 11,322,284 B2* | 5/2022 | Ueki | H01F 27/2804 |
| 2014/0138792 A1 | 5/2014 | Lo et al. | |
| 2016/0344181 A1 | 11/2016 | Matsunaga | |
| 2017/0117868 A1 | 4/2017 | Ishizuka et al. | |
| 2017/0133999 A1* | 5/2017 | Ishizuka | H03H 7/20 |
| 2019/0051440 A1 | 2/2019 | Ueki | |

FOREIGN PATENT DOCUMENTS

| | | |
|---|---|---|
| WO | 2016/114181 A1 | 7/2016 |
| WO | 2018/012400 A1 | 1/2018 |

* cited by examiner

COIL DEVICE, PHASE SHIFT CIRCUIT, AND COMMUNICATION APPARATUS

CROSS REFERENCE TO RELATED APPLICATIONS

This application claims the benefit of priority to Japanese Patent Application No. 2019-030411 filed on Feb. 22, 2019 and is a Continuation Application of PCT Application No. PCT/JP2020/005091 filed on Feb. 10, 2020. The entire contents of each application are hereby incorporated herein by reference.

BACKGROUND OF THE INVENTION

1. Field of the Invention

The present invention relates to a coil device having a phase shift characteristic, a phase shift circuit including the coil device, and a communication apparatus including the coil device or the phase shift circuit.

2. Description of the Related Art

International Publication No. 2016/114181 discloses a coil device including a transformer having a first coil and a second coil that are magnetically coupled to each other, and a capacitor connected between the first coil and the second coil.

According to a structure disclosed in International Publication No. 2016/114181, a coil device, a phase shift circuit, and a communication apparatus are obtained which are advantageous for reducing size, reducing loss, reducing frequency dependence of an amount of phase shift, and the like.

In the coil device described in International Publication No. 2016/114181, the capacitor connected between the first coil and the second coil acts as an impedance adjustment circuit that adjusts an impedance of the transformer. However, when the capacitor is configured of only a capacitance parasitically generated between the first coil and the second coil, the capacitance required for impedance adjustment may not be obtained in some cases. In that case, in order to appropriately adjust the impedance, it is necessary to specially provide a conductor pattern other than the first coil and the second coil (for example, a planar conductor pattern that spreads in a planar shape and faces each other). However, when the planar conductor pattern described above is arranged in the coil device together with the first coil and the second coil, the magnetic field generated by the first coil and the second coil is hindered by the planar conductor pattern, and therefore, problems such as a decrease in an excitation inductance and a decrease in a magnetic field coupling coefficient between the first coil and the second coil occur. Further, in order to obtain the necessary excitation inductance and magnetic field coupling coefficient, the number of turns of the first coil and the second coil is increased, thus causing a new problem, such as an increase in loss and an increase in size (an increase in the number of laminated layers).

SUMMARY OF THE INVENTION

Preferred embodiments of the present invention provide coil devices each including a capacitor necessary for impedance adjustment while avoiding an increase in loss and an increase in size due to an increase in the number of coil turns, phase shift circuits each including the coil device, and communication apparatuses each including the coil device or the phase shift circuit.

A coil device according to a preferred embodiment of the present disclosure includes an insulating substrate; and a first input/output terminal, a second input/output terminal, a common terminal, a first coil, and a second coil, each of which is provided on the insulating substrate, wherein the first coil includes a first coil conductor with a shape wound around a first winding axis, the second coil includes a second coil conductor with a shape wound around a second winding axis parallel or substantially parallel to a direction of the first winding axis, the first coil includes a plurality of first coil conductors provided over a plurality of layers, the plurality of first coil conductors including an input/output terminal side first coil conductor with one end connected to an input/output terminal, the second coil includes a plurality of second coil conductors provided over a plurality of layers, the plurality of second coil conductors including an input/output terminal side second coil conductor with one end connected to an input/output terminal, the input/output terminal side first coil conductor is located between two second coil conductors among the plurality of second coil conductors in a direction of the second winding axis, and overlaps the two second coil conductors when viewed in a direction of the second winding axis, one of the two second coil conductors is the input/output terminal side second coil conductor, the input/output terminal side second coil conductor is located between two first coil conductors among the plurality of first coil conductors in a direction of the first winding axis, and overlaps the two first coil conductors when viewed in a direction of the first winding axis, and one of the two first coil conductors is the input/output terminal side first coil conductor.

According to preferred embodiments of the present invention, it is possible to obtain coil devices each having a capacitance required for impedance adjustment without an increase in loss and an increase in size due to an increase in the number of coil turns, phase shift circuits each including the coil device, and communication apparatuses each including the coil device or the phase shift circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
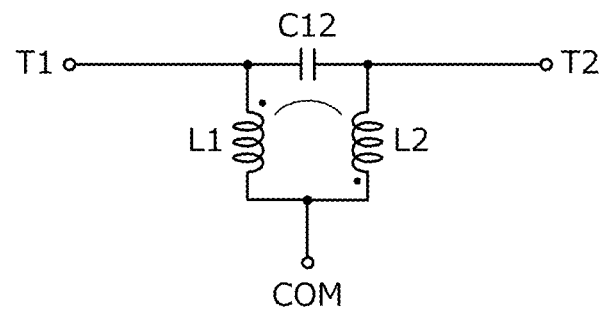
FIG. 1 is a circuit diagram of a coil device 11 according to a first preferred embodiment of the present invention.

First, some aspects of coil devices according to various preferred embodiments of the present invention will be described.

A coil device according to a preferred embodiment of the present invention includes an insulating substrate, and a first input/output terminal, a second input/output terminal, a common terminal, a first coil, and a second coil, which are provided on the insulating substrate. The first coil includes a first coil conductor with a shape wound around a first winding axis. The second coil includes a second coil conductor with a shape wound around a second winding axis parallel or substantially parallel to a direction of the first winding axis. The first coil includes a plurality of first coil conductors provided over a plurality of layers, the plurality of first coil conductors include an input/output terminal side first coil conductor with one end connected to an input/output terminal, the second coil includes a plurality of second coil conductors provided over a plurality of layers, and the plurality of second coil conductors include an input/output terminal side second coil conductor with one end connected to an input/output terminal. The input/output terminal side first coil conductor is located between two second coil conductors among the plurality of second coil conductors in a direction of the second winding axis, and overlaps the two second coil conductors when viewed in a direction of the second winding axis. One of the two second coil conductors is the input/output terminal side second coil conductor. Further, the input/output terminal side second coil conductor is located between two first coil conductors among the plurality of first coil conductors in a direction of a first winding axis, and overlaps the two first coil conductors when viewed in a direction of the first winding axis. One of the two first coil conductors is the input/output terminal side first coil conductor.

According to the above configuration, since a total facing area of the first coil conductor and the second coil conductor is large, a capacitance generated between the first coil and the second coil can be increased easily. Therefore, the capacitance required for the impedance adjustment of the coil device can be obtained.

In a coil device according to a preferred embodiment of the present invention, another of the two first coil conductors, which is different from the input/output terminal side first coil conductor, is a common terminal side first coil conductor with one end connected to the common terminal, and another of the two second coil conductors, which is different from the input/output terminal side second coil conductor, is a common terminal side second coil conductor with one end connected to the common terminal. According to this configuration, in the first winding axis direction or the second winding axis direction, a coil device is provided in which the common terminal side first coil conductor, the input/output terminal side second coil conductor, the input/output terminal side first coil conductor, the common terminal side second coil conductor are arranged in this order, or the common terminal side second coil conductor, the input/output common terminal side first coil conductor, the input/output terminal side second coil conductor, and the common terminal side second coil conductor are arranged in this order.

In a coil device according to a preferred embodiment of the present invention, the plurality of first coil conductors include a common terminal side first coil conductor with one end connected to the common terminal, and an intermediate first coil conductor sandwiched between the input/output terminal side first coil conductor and the common terminal side first coil conductor in a direction of the first winding axis, and the other of the two first coil conductors, which is different from the input/output terminal side first coil conductor, is the intermediate first coil conductor. Further, the plurality of second coil conductors include a common terminal side second coil conductor with one end connected to the common terminal, and an intermediate second coil conductor sandwiched between the input/output terminal side second coil conductor and the common terminal side second coil conductor in a direction of the second winding axis, and the other of the two second coil conductors, which is different from the input/output terminal side second coil conductor, is the intermediate second coil conductor. According to this configuration, in the first winding axis direction or the second winding axis direction, a coil device is provided in which the common terminal side first coil conductor, the intermediate first coil conductor, the input/output terminal side second coil conductor, the input/output terminal side first coil conductor, the intermediate second coil conductor, the common terminal side second coil conductor are arranged in this order, or the common terminal side second coil conductor, the intermediate second coil conductor, the input/output terminal side first coil conductor, the input/output terminal side second coil conductor, the intermediate first coil conductor, the common terminal side first coil conductor are arranged in this order.

In a coil device according to a preferred embodiment of the present invention, a line width of the input/output terminal side first coil conductor includes a portion thicker than a line width of the common terminal side first coil conductor, and a line width of the input/output terminal side second coil conductor includes a portion thicker than a line width of the common terminal side second coil conductor. According to this configuration, a capacitance generated between the first coil conductor and the second coil conductor is effectively increased.

In a coil device according to a preferred embodiment of the present invention, the number of turns of the input/output terminal side first coil conductor is greater than the number of turns of the common terminal side first coil conductor, and the number of turns of the input/output terminal side second coil conductor is greater than the number of turns of the common terminal side second coil conductor. According to this configuration, the capacitance generated between the first coil conductor and the second coil conductor is effectively increased.

In a coil device according to a preferred embodiment of the present invention, the number of turns of the input/output terminal side first coil conductor is greater than 1, and an interlayer connection conductor connected to the input/ output terminal side first coil conductor is located in a coil opening of the input/output terminal side second coil conductor. Further, the number of turns of the input/output terminal side second coil conductor is greater than 1, and an interlayer connection conductor connected to the input/output terminal side second coil conductor is located in a coil opening of the input/output terminal side first coil conductor. According to this configuration, as compared with a structure in which the interlayer connection conductor is on an outer side portion of the coil opening, a proportion of the coil conductor that does not contribute to the magnetic field coupling is reduced (a magnetic flux generated by the coil conductor is less likely to leak to the outside), and as a result, it is possible to reduce the loss and reduce the size of the coil conductor.

A phase shift circuit according to a preferred embodiment of the present invention includes the above-described coil device and a phase shift line connected in series to the coil device and having an amount of phase shift of less than about 90°.

A communication apparatus according to a preferred embodiment of the present invention includes a transmission/reception circuit and an antenna connected to the transmission/reception circuit, and includes the above-described coil device or the phase shift circuit between the transmission/reception circuit and the antenna.

A communication apparatus according to a preferred embodiment of the present invention includes a transmission/reception circuit and a diplexer connected to the transmission/reception circuit, and includes the above-described coil device or the phase shift circuit between the transmission/reception circuit and the diplexer.

Hereinafter, preferred embodiments of the present invention will be described by using some specific examples with reference to the drawings. In the drawings, the same reference numerals denote the same or corresponding portions and elements. In consideration of the ease of description or the ease of understanding of main points, for convenience of description, the preferred embodiments are divided into a plurality of preferred embodiments, but partial substitutions or combinations of configurations described in different preferred embodiments are possible. In a second and subsequent preferred embodiments, descriptions of matters common to those in a first preferred embodiment will be omitted, and only different points will be described. In particular, similar advantageous actions and effects according to the same or substantially the same configuration will not be described in detail for each preferred embodiment.

First Preferred Embodiment

FIG. 1 is a circuit diagram of a coil device 11 according to a first preferred embodiment of the present invention. The coil device 11 includes a first input/output terminal T1, a second input/output terminal T2, a common terminal COM, a first coil L1, and a second coil L2. The first coil L1 and the second coil L2 are magnetically coupled to each other. A transformer is defined by the first coil L1 and the second coil L2.

An input-output capacitor C12 is provided between the first coil L1 and the second coil L2.

Figure 2A:
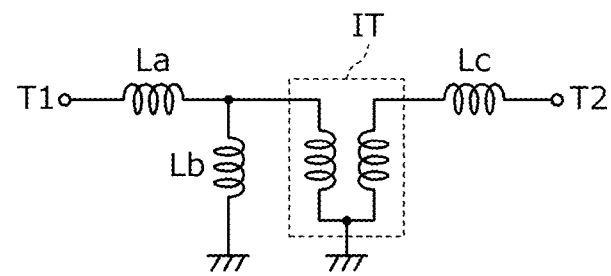
FIGS. 2A and 2B are equivalent circuit diagrams of a transformer in the coil device 11.
Figure 2B:
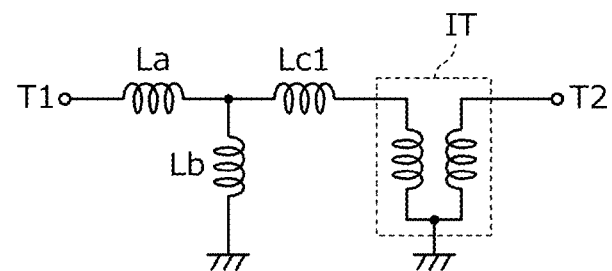

FIGS. 2A and 2B are equivalent circuit diagrams of the transformer. The equivalent circuit of the transformer may be expressed in several configurations. A representation of FIG. 2A is illustrated by an ideal transformer IT, an inductor La connected in series to a primary side of the ideal transformer IT, an inductor Lb connected in parallel to the primary side, and an inductor Lc connected in series to a secondary side.

A representation of FIG. 2B is illustrated by the ideal transformer IT, two inductors La and Lc1 connected in series to the primary side of the ideal transformer IT, and the inductor Lb connected in parallel to the primary side of the ideal transformer IT.

Here, when a transformer ratio of the transformer is represented by $1:\sqrt{(L2/L1)}$, a coupling coefficient between the first coil L1 and the second coil L2 (see FIG. 1) is represented by k, an inductance of the first coil L1 is represented by L1, and an inductance of the second coil L2 is represented by L2, inductances of the inductors La, Lb, Lc, and Lc1 preferably satisfy the following relationships.

La:L1(1−k)
Lb:k*L1
Lc:L2(1−k)
Lc1:L1(1−k)

The transformer ratio of the ideal transformer IT is a ratio of the number of turns of the first coil L1 and the second coil L2.

In any case, in the transformer, a series inductance (leakage inductance) component is generated in addition to a parallel inductance (excitation inductance) component, as the coupling coefficient k between the first coil L1 and the second coil L2 is less than 1.

Figure 3:
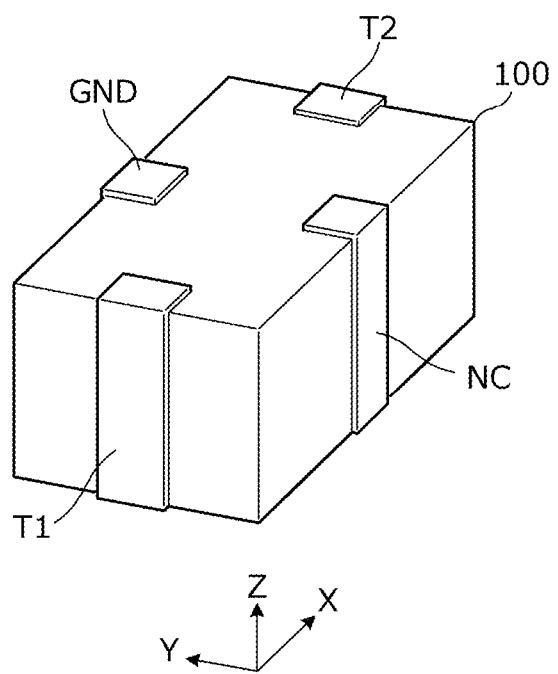
FIG. 3 is an external perspective view of the coil device 11.
Figure 4:
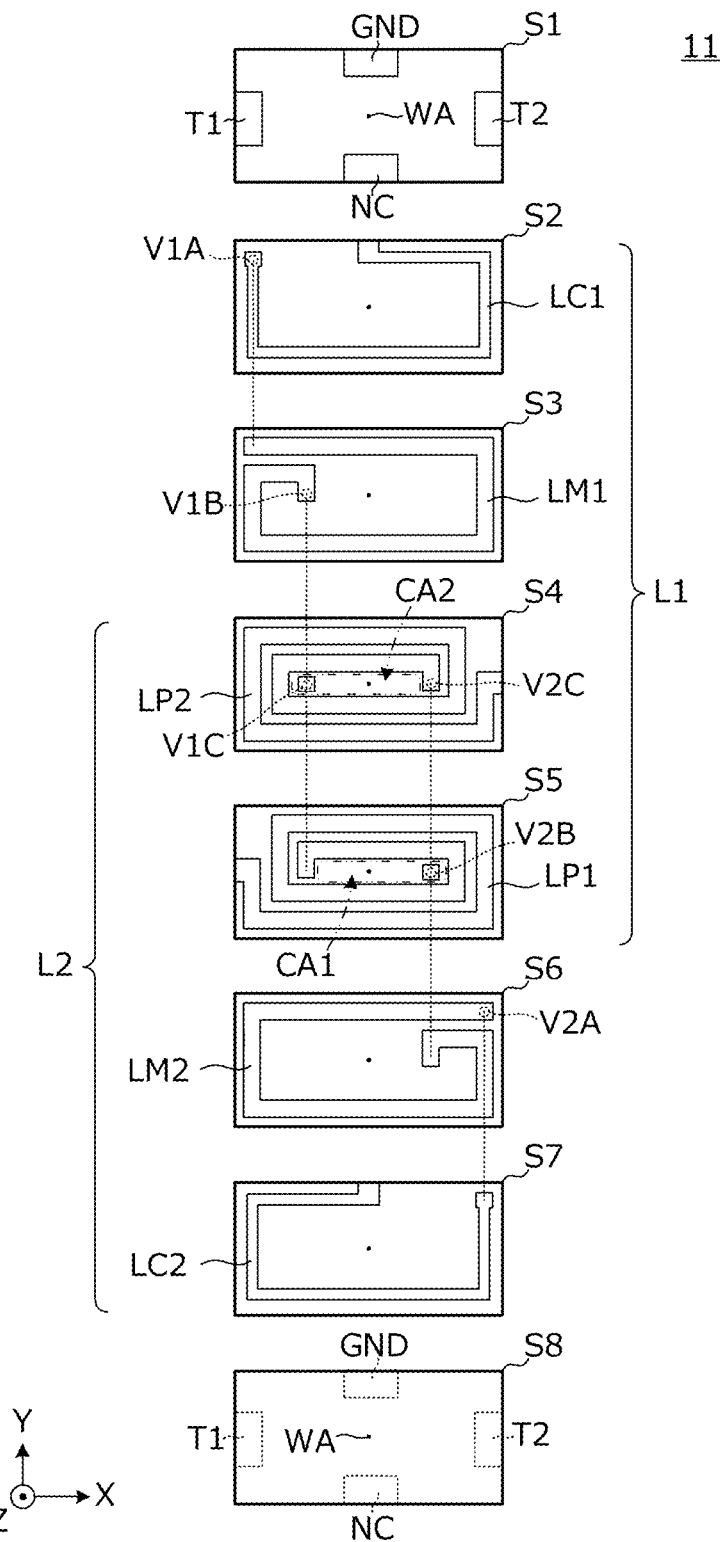
FIG. 4 is a plan view of each substrate of the coil device 11.
Figure 5:
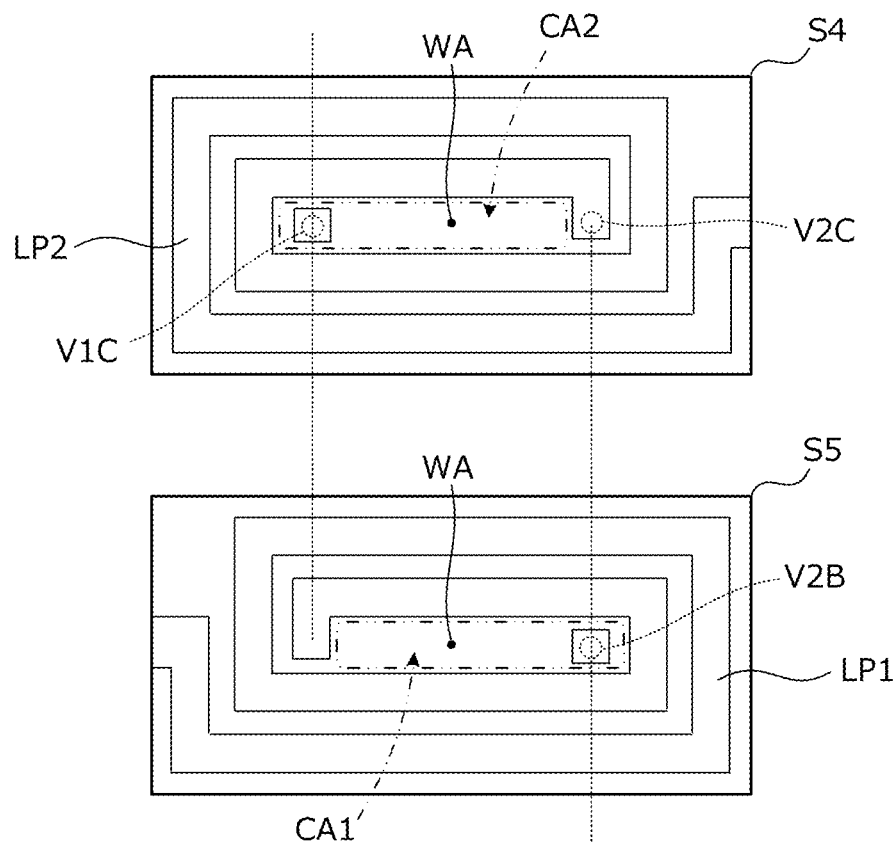
FIG. 5 is an enlarged view of a portion of FIG. 4.
Figure 6:
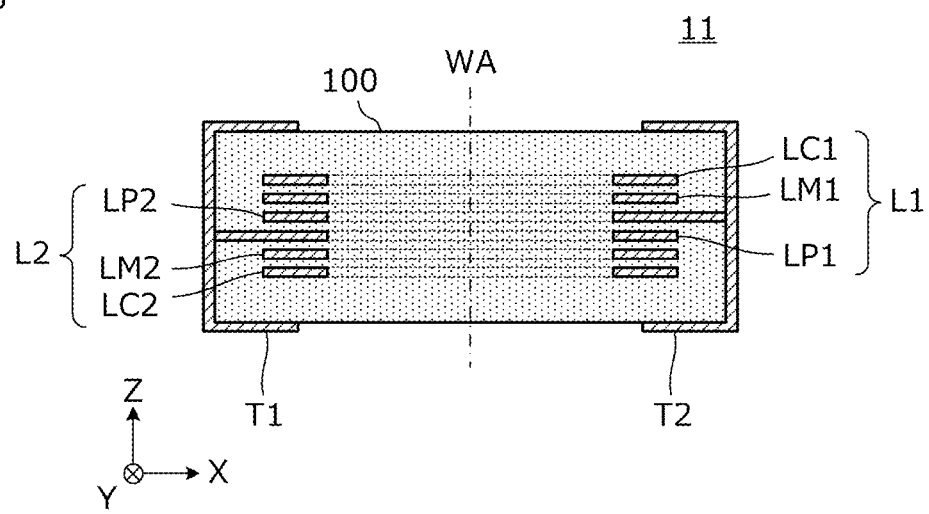
FIG. 6 is a longitudinal sectional view of the coil device 11.

FIG. 3 is an external perspective view of the coil device 11 of the present preferred embodiment, and FIG. 4 is a plan view of each substrate of the coil device 11. FIG. 5 is an enlarged view of a portion of FIG. 4. Further, FIG. 6 is a longitudinal sectional view of the coil device 11.

The coil device 11 includes a plurality of insulating substrates S1 to S8. A multilayer body 100 (corresponding to the insulating substrate) is provided by laminating the substrates S1 to S8. In the state before the lamination and pressure bonding, each of the substrates S1 to S8 is an insulating sheet, for example, a ceramic green sheet such as a non-magnetic ceramic made of low temperature co-fired ceramics (LTCC) or the like. Various conductor patterns are provided on the substrates S1 to S8. The "various conductor patterns" include not only a conductor pattern provided on a surface of the substrate, but also an interlayer connection conductor. Here, the "interlayer connection conductor" includes not only a via conductor but also an end surface electrode provided on an end surface of the multilayer body 100.

The above-described various conductor patterns are made of a conductor material having a low specific resistance including, for example, Ag or Cu as a main component. When a substrate layer is a ceramic, it is formed by screen printing and firing of a conductive paste including Ag or Cu as a main component, for example.

When the substrates S1 to S8 are ceramic green sheets, the substrates S1 to S8 are laminated and fired to form a ceramic mother substrate, and the ceramic mother substrate is divided, thus obtaining a large number of multilayer bodies 100. The coil device 11 is configured by forming an end surface electrode on an outer surface of the multilayer body 100.

A lower surface of the substrate S8 corresponds to a lower surface (mounting surface of the coil device 11) of the multilayer body 100. The first input/output terminal T1, the second input/output terminal T2, a ground terminal GND as the common terminal, and a free terminal NC extend from an upper surface of the substrate S1 to the lower surface of the substrate S8 with the substrates S2 to S7 interposed therebetween.

In the substrates S2, S3, and S5, a common terminal side first coil conductor LC1, an intermediate first coil conductor LM1, and an input/output terminal side first coil conductor LP1 are provided, respectively. Via conductors V1A, V1B, and V1C are provided in the substrates S2, S3, and S4, respectively. A first end of the common terminal side first coil conductor LC1 is connected to the ground terminal GND. A second end of the common terminal side first coil conductor LC1 is connected to a first end of the intermediate first coil conductor LM1 via the via conductor V1A. The second end of t the intermediate first coil conductor LM1 is connected to a first end of the input/output terminal side first coil conductor LP1 by the via conductors V1B and V1C. A second end of the input/output terminal side first coil conductor LP1 is connected to the first input/output terminal T1.

The common terminal side first coil conductor LC1, the intermediate first coil conductor LM1, the input/output terminal side first coil conductor LP1, and the via conductors V1A, V1B, and V1C described above correspond to a "first coil conductor". The first coil L1 includes the first coil conductor.

In the substrates S7, S6, and S4, a common terminal side second coil conductor LC2, an intermediate second coil conductor LM2, and an input/output terminal side second coil conductor LP2 are formed, respectively. Via conductors V2A, V2B, and V2C are provided in the substrates S6, S5, and S4, respectively. A first end of the common terminal side second coil conductor LC2 is connected to the ground terminal GND. A second end of the common terminal side second coil conductor LC2 is connected to a first end of the intermediate second coil conductor LM2 by the via conductor V2A. A second end of the intermediate second coil conductor LM2 is connected to a first end of the input/output terminal side second coil conductor LP2 by the via conductors V2B and V2C. A second end of the input/output terminal side second coil conductor LP2 is connected to the second input/output terminal T2.

The common terminal side second coil conductor LC2, the intermediate second coil conductor LM2, the input/output terminal side second coil conductor LP2, and the via conductors V2A, V2B, and V2C described above correspond to a "second coil conductor". The second coil L2 includes the second coil conductor.

As shown in FIG. 4 and FIG. 6, each of the first coil conductor and the second coil conductor has a shape wound around a winding axis WA, and a winding axis direction of the coil conductor of each of the first coil L1 and the second coil L2 corresponds to an axis illustrated in FIG. 4 and FIG. 6, that is, a Z-axis direction. The winding axis WA corresponds to a "first winding axis" and a "second winding axis". In the present preferred embodiment, the winding axis of the first coil conductor (first winding axis) coincides with the winding axis of the second coil conductor (second winding axis). Further, the winding axis of the first coil conductor (first winding axis) and the winding axis of the second coil conductor (second winding axis) do not have to coincide with each other, and may be parallel or substantially parallel to each other only. In the present application, "parallel" also includes "coinciding". However, in the case of "parallel", a coil opening of the first coil conductor and a coil opening of the second coil conductor overlap each other when viewed in the winding axis direction.

In this way, the first coil conductor includes the common terminal side first coil conductor LC1 with one end connected to the ground terminal GND, the intermediate first coil conductor LM1, and the input/output terminal side first coil conductor LP1 with one end connected to the first input/output terminal T1.

Similarly, the second coil conductor includes the common terminal side second coil conductor LC2 with one end connected to the ground terminal GND, the intermediate second coil conductor LM2, and the input/output terminal side second coil conductor LP2 with one end connected to the second input/output terminal T2.

Further, the above-described insulating substrate is not limited to LTCC, and may be formed by repeating application of an insulating paste including glass as a main component by screen printing, for example. In this case, the above-described various conductor patterns are formed on the substrate by a photolithography process, for example.

Hereinafter, a characteristic configuration of the first coil conductor and the second coil conductor will be described.

Positional Relationship in Lamination Direction of Each Coil Conductor Pattern

In the winding axis direction of the first coil L1 (the lamination direction of the substrate), the input/output terminal side first coil conductor LP1 is located between the intermediate second coil conductor LM2 and the input/output terminal side second coil conductor LP2.

Similarly, in the winding axis direction of the second coil L2 (the lamination direction of the substrate), the input/output terminal side second coil conductor LP2 is located between the intermediate first coil conductor LM1 and the input/output terminal side first coil conductor LP1.

As described above, a relationship is provided in which a portion of the first coil conductor that is an element of the first coil L1 and a portion of the second coil conductor that is an element of the second coil L2 are sandwiched between the other coil conductors each other. As a result, a total facing area of the first coil conductor and the second coil conductor is increased. In other words, the total facing area of the first coil conductor and the second coil conductor is an area of a portion where the first coil conductor and the second coil conductor overlap each other when viewed in the lamination direction. Accordingly, a capacitance generated between the first coil L1 and the second coil L2 can be easily increased, and a capacitance required for adjusting the impedance of the coil device 11 can be obtained. Further, the intermediate first coil conductor and the intermediate second coil conductor may include a plurality of layers in accordance with a desired inductance value.

Line Width of Each Coil Conductor Pattern

A line width of the input/output terminal side first coil conductor LP1 includes a portion thicker than line widths of the common terminal side first coil conductor LC1 and the intermediate first coil conductor LM1. In this example, the line width of the input/output terminal side first coil conductor LP1 is thicker than the line width of the common terminal side first coil conductor LC1. Therefore, a capacitance generated between the input/output terminal side first coil conductor LP1 and the input/output terminal side second coil conductor LP2, and a capacitance generated between the intermediate first coil conductor LM1 and the input/output terminal side second coil conductor LP2 are effectively increased. Further, since the line width of the common terminal side first coil conductor LC1 is thinner than the line width of the input/output terminal side first coil conductor LP1, the inductance of the first coil can be increased, and a parasitic capacitance that is not intended by a designer can be reduced or prevented, and thus a desired inductance value can be obtained.

Similarly, a line width of the input/output terminal side second coil conductor LP2 includes a portion thicker than line widths of the common terminal side second coil conductor LC2 and the intermediate second coil conductor LM2. In this example, the line width of the input/output terminal side second coil conductor LP2 is thicker than the line width of the common terminal side second coil conductor LC2. Therefore, a capacitance generated between the input/output terminal side second coil conductor LP2 and the input/output terminal side first coil conductor LP1, and a capacitance generated between the intermediate second coil conductor LM2 and the input/output terminal side first coil conductor LP1 are effectively increased. Further, since the line width of the common terminal side second coil conductor LC2 is thinner than the line width of the input/output terminal side second coil conductor LP2, an inductance of the second coil can be increased, and a parasitic capacitance that is not intended by the designer can be reduced or prevented, and thus a desired inductance value can be obtained.

Number of Turns of Each Coil Conductor Pattern

The number of turns of the input/output terminal side first coil conductor LP1 is larger than the number of turns of the common terminal side first coil conductor LC1. In the example illustrated in FIG. 4, the number of turns of the input/output terminal side first coil conductor LP1 is approximately two turns, and the number of turns of the common terminal side first coil conductor LC1 is approximately 0.75 turns. Therefore, the capacitance generated between the input/output terminal side first coil conductor LP1 and the input/output terminal side second coil conductor LP2 is effectively increased.

Similarly, the number of turns of the input/output terminal side second coil conductor LP2 is larger than the number of turns of the common terminal side second coil conductor LC2. In the example illustrated in FIG. 4, the number of turns of the input/output terminal side second coil conductor LP2 is approximately two turns, and the number of turns of the common terminal side second coil conductor LC2 is approximately 0.75 turns, for example. Therefore, the capacitance generated between the input/output terminal side second coil conductor LP2 and the input/output terminal side first coil conductor LP1 is effectively increased.

Note that the number of turns of the intermediate first coil conductor LM1 is smaller than the number of turns of the input/output terminal side first coil conductor LP1, and is greater than the number of turns of the common terminal side first coil conductor LC1. Similarly, the number of turns of the intermediate second coil conductor LM2 is smaller than the number of turns of the input/output terminal side second coil conductor LP2, and is greater than the number of turns of the common terminal side second coil conductor LC2.

Among the first coil conductor patterns provided on the respective substrates, the input/output terminal side first coil conductor LP1 has the greatest number of turns, and the common terminal side first coil conductor LC1 has the smallest number of turns. Similarly, among the second coil conductor patterns formed on the respective substrates, the input/output terminal side second coil conductor LP2 has the greatest number of turns, and the common terminal side second coil conductor LC2 has the smallest number of turns.

Position of Via Conductor Connecting Coil Conductor Patterns

The number of turns of the input/output terminal side first coil conductor LP1 is greater than 1, and the via conductor V1C connected to the input/output terminal side first coil conductor LP1 is located in a coil opening CA2 of the input/output terminal side second coil conductor LP2 (see FIG. 5). According to this configuration, as compared with a structure in which the via conductor V1C is on an outer side portion of the coil opening, the turns of the input/output terminal side first coil conductor LP1 and the input/output terminal side second coil conductor LP2 can be relatively large, and therefore, the degree of freedom in designing the inductance value is increased. In addition, in a case where the via conductor is on the outer side portion of the coil opening, the magnetic flux generated from the via conductor spreads to the outside of the coil device, and therefore, the magnetic flux is easily coupled to other devices arranged around the coil device. In this case, the coil device and the other devices interfere with each other, and there is a possibility that the characteristics of the coil device and the other devices may change. However, in a case where the via conductor is in the coil opening and closer to the center side of the coil device as in the above-described configuration, the magnetic flux is less likely to leak out of the coil device, and the interference with and the change of the characteristics of the other devices can be reduced or prevented. Further, in a case where a plurality of via conductors are provided, by providing them in the coil opening, it is easy to position the via conductors in proximity to each other, and it is possible to increase the magnetic field coupling and the capacitive coupling.

Similarly, the number of turns of the input/output terminal side second coil conductor LP2 is greater than 1, and the via conductor V2B connected to the input/output terminal side second coil conductor LP2 is located in a coil opening CA1 of the input/output terminal side first coil conductor LP1 (see FIG. 5). According to this configuration, as compared with a structure in which the via conductor V2B is on the outer side portion of the coil opening, the proportion of the coil conductor that does not contribute to the magnetic field coupling is reduced (the magnetic flux generated by the coil conductor is less likely to leak out), and as a result, the loss and the size are reduced.

Note that each substrate layer of the multilayer body 100 may be, for example, a resin multilayer body made of a resin material such as polyimide, a liquid crystal polymer, or the like, or a multilayer body made of an insulating paste containing glass as a main component. As described above, since the substrate layer is a non-magnetic material (since the substrate layer is not a magnetic ferrite), the coil device can be used as a transformer and a phase shifter with a predetermined inductance and a predetermined coupling coefficient even in a high-frequency band of over 700 MHz.

When the substrate layer is a resin, the above-described conductor pattern and the interlayer connection conductor are formed by patterning a metal foil such as an Al foil, a Cu foil, or the like by etching or the like, for example. In a case where the substrate layer is made of an insulating paste including glass as a main component, the above-described various conductor patterns are formed by, for example, a photolithography process using a photosensitive conductive paste.

Figure 7A:
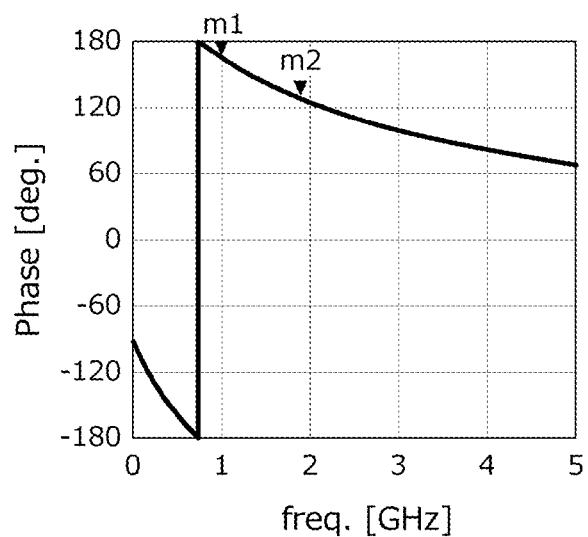
FIG. 7A is a graph illustrating frequency characteristics of an amount of phase shift of the coil device 11.

FIG. 7A is a graph illustrating the frequency characteristics of an amount of phase shift of the coil device 11 according to the present preferred embodiment. In this graph, the horizontal axis represents the frequency, and the vertical axis represents the amount of phase shift. The amount of phase shift is expressed in the range of ±180°. In this example, a marker m1 indicates the amount of phase shift at the frequency 1 GHz, and a marker m2 indicates the amount of phase shift at the frequency 1.9 GHz, respectively. As indicated in FIG. 7A, when the amount of phase shift is negative, an absolute value of a read value is the amount of phase shift, and when the amount of phase shift is positive, an absolute value of a value obtained by subtracting 360° from the read value is the amount of phase shift. That is, the amount of phase shift is |170°−360°|=190° at 1 GHz, and |130°−360°|=230° at 1.9 GHz.

As described above, even when the frequencies have an approximately two-fold difference, the amount of phase shift only has a difference of about 40°, and the same or substantially the same degree of amount of phase shift is maintained.

Figure 7B:
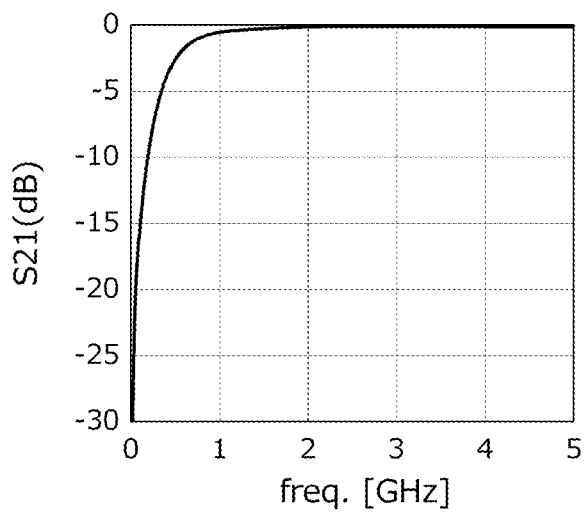
FIG. 7B a graph illustrating frequency characteristics of an insertion loss of the coil device 11.

FIG. 7B is a graph illustrating the frequency characteristics of insertion loss of the coil device 11 according to the present preferred embodiment. The insertion loss is about −1 dB at the frequency 1 GHz and about 0 dB at the frequency 1.9 GHz, and a low insertion loss characteristic is obtained. In this example, the insertion loss is lower at the frequency 1.9 GHz than the insertion loss at the frequency 1 GHz. This is because signal components directly passing through the input-output capacitor C12 are increased without using the transformer by the first coil L1 and the second coil L2.

Second Preferred Embodiment

In a second preferred embodiment of the present invention, an example of the coil device in which the input/output terminal side coil conductor includes a plurality of layers will be described.

Figure 8:
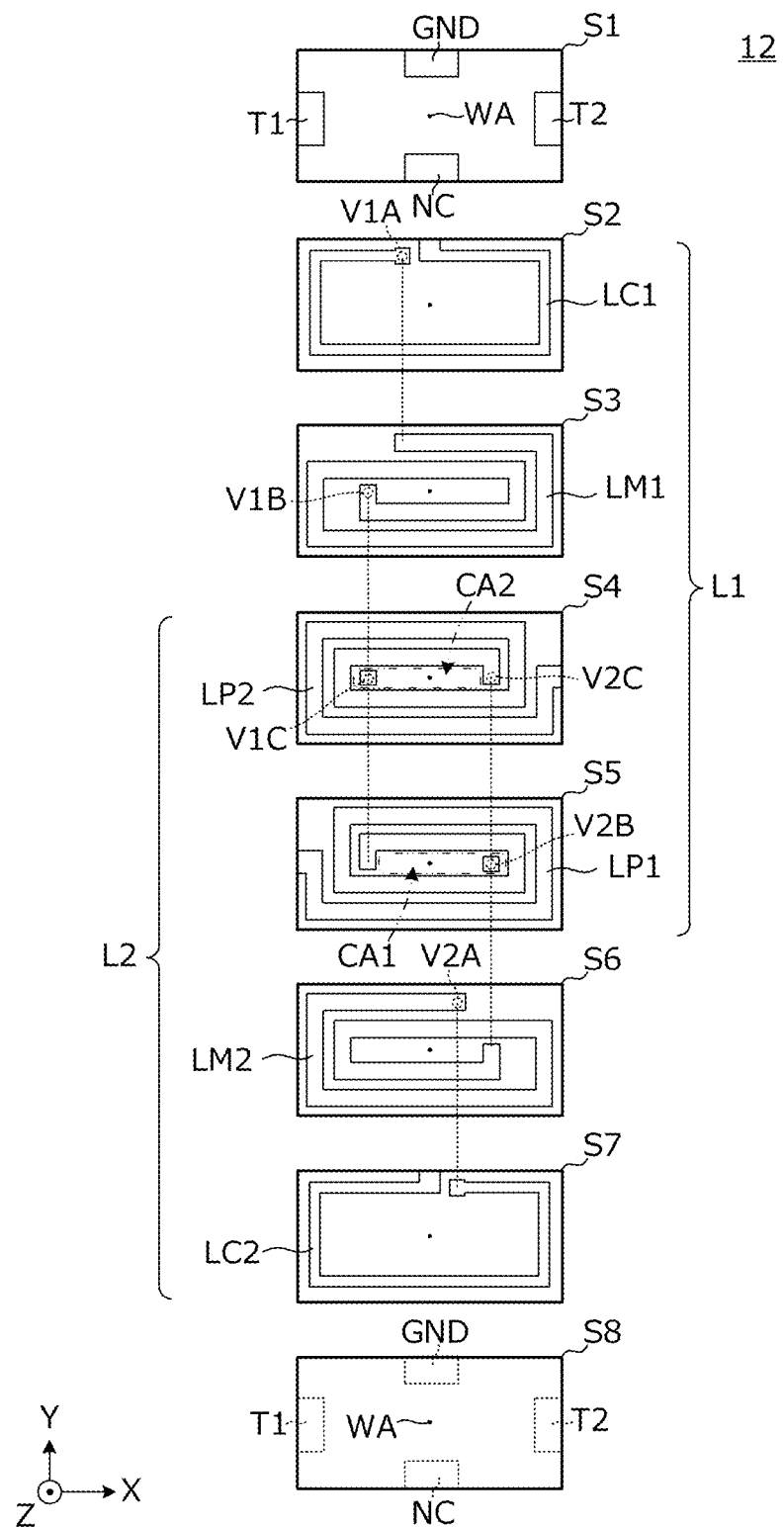
FIG. 8 is a plan view of each substrate of a coil device according to a second preferred embodiment of the present invention.

FIG. 8 is a plan view of each substrate of a coil device 12 according to the second preferred embodiment. The coil device 12 includes a plurality of insulating substrates S1 to S8.

The lower surface of the substrate S8 corresponds to a mounting surface of the coil device 12. The substrate S8 is provided with the first input/output terminal T1, the second input/output terminal T2, the ground terminal GND as a common terminal, and the free terminal NC.

In the substrates S2, S3, and S5, the common terminal side first coil conductor LC1, the intermediate first coil conductor LM1, and the input/output terminal side first coil conductor LP1 are provided, respectively. The via conductors V1A, V1B, and V1C are provided in the substrates S2, S3, and S4, respectively. The first end of the common terminal side first coil conductor LC1 is connected to the ground terminal GND. The second end of the common terminal side first coil conductor LC1 is connected to the first end of the intermediate first coil conductor LM1 by the via conductor V1A. A second end of the intermediate first coil conductor LM1 is connected to the first end of the input/output terminal side first coil conductor LP1 by the via conductors V1B and V1C. The second end of the input/output terminal side first coil conductor LP1 is connected to the first input/output terminal T1.

The common terminal side first coil conductor LC1, the intermediate first coil conductor LM1, the input/output terminal side first coil conductor LP1, and the via conductors V1A, V1B, and V1C described above correspond to the "first coil conductor". The first coil L1 includes the first coil conductor.

In the substrates S7, S6, and S4, the common terminal side second coil conductor LC2, the intermediate second coil conductor LM2, and the input/output terminal side second coil conductor LP2 are provided, respectively. The via conductors V2A, V2B, and V2C are provided in the substrates S6, S5, and S4, respectively. The first end of the common terminal side second coil conductor LC2 is connected to the ground terminal GND. The second end of the common terminal side second coil conductor LC2 is connected to the first end of the intermediate second coil conductor LM2 by the via conductor V2A. The second end of the intermediate second coil conductor LM2 is connected to the first end of the input/output terminal side second coil conductor LP2 by the via conductors V2B and V2C. The second end of the input/output terminal side second coil conductor LP2 is connected to the second input/output terminal T2.

The common terminal side second coil conductor LC2, the intermediate second coil conductor LM2, the input/output terminal side second coil conductor LP2, and the via conductors V2A, V2B, and V2C described above correspond to the "second coil conductor". The second coil L2 includes the second coil conductor. Further, the intermediate first coil conductor LM1 and the intermediate second coil conductor LM2 are not limited thereto, and may be a plurality of layers in accordance with a desired inductance value.

The other configurations of the coil device are the same or substantially the same as those described in the first preferred embodiment. In the coil device 12 of the present preferred embodiment, the number of turns of the intermediate first coil conductor LM1 close to the input/output terminal side first coil conductor LP1 and the number of turns of the intermediate second coil conductor LM2 close to the input/output terminal side second coil conductor LP2 each are equal to or more than 1.

According to the present preferred embodiment, since the total facing area of the first coil conductor and the second coil conductor is larger than that in the example shown in the first preferred embodiment, the capacitance generated between the first coil L1 and the second coil L2 can be further increased.

Third Preferred Embodiment

In a third preferred embodiment of the present invention, an example of the coil device in which each of the common terminal side coil conductor and the input/output terminal side coil conductor is provided as a single layer will be described.

Figure 9:
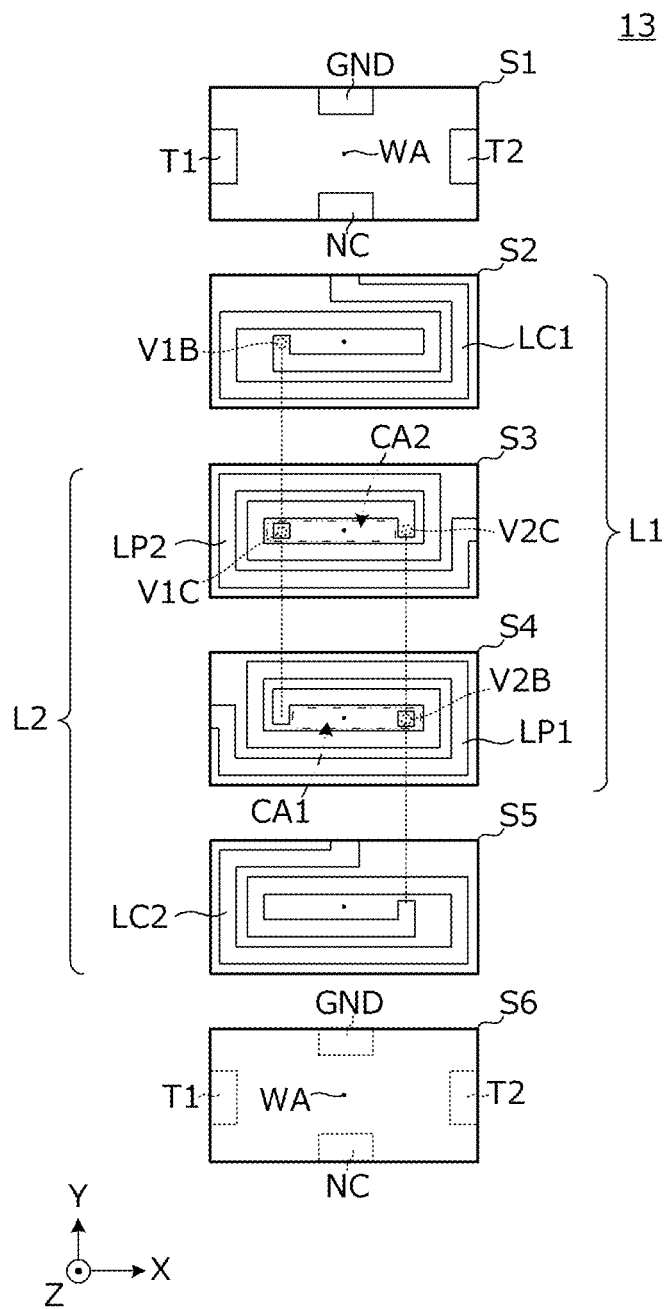
FIG. 9 is a plan view of each substrate of a coil device according to a third preferred embodiment of the present invention.

FIG. 9 is a plan view of each substrate of a coil device 13 according to the third preferred embodiment. The coil device 13 includes a plurality of insulating substrates S1 to S6.

The lower surface of the substrate S8 corresponds to a mounting surface of the coil device 13. The substrate S8 includes the first input/output terminal T1, the second input/output terminal T2, the ground terminal GND as a common terminal, and the free terminal NC.

In the substrates S2 and S4, the common terminal side first coil conductor LC1 and the input/output terminal side first coil conductor LP1 are provided, respectively. The via conductors V1B and V1C are provided in the substrates S2 and S3, respectively. The first end of the common terminal side first coil conductor LC1 is connected to the ground terminal GND. The second end of the common terminal side first coil conductor LC1 is connected to the first end of the input/output terminal side first coil conductor LP1 by the via conductors V1B and V1C. The second end of the input/output terminal side first coil conductor LP1 is connected to the first input/output terminal T1.

The common terminal side first coil conductor LC1, the input/output terminal side first coil conductor LP1, and the via conductors V1B and V1C described above correspond to the "first coil conductor". The first coil L1 includes the first coil conductor.

In the substrates S5 and S3, the common terminal side second coil conductor LC2 and the input/output terminal side second coil conductor LP2 are provided, respectively. The via conductors V2B and V2C are provided in the substrates S4 and S3, respectively. The first end of the common terminal side second coil conductor LC2 is connected to the ground terminal GND. The second end of the common terminal side second coil conductor LC2 is connected to the first end of the input/output terminal side second coil conductor LP2 by the via conductors V2B and V2C. The second end of the input/output terminal side second coil conductor LP2 is connected to the second input/output terminal T2.

The common terminal side second coil conductor LC2, the input/output terminal side second coil conductor LP2, and the via conductors V2B and V2C described above correspond to the "second coil conductor". The second coil L2 includes the second coil conductor.

The other configurations of the coil device are the same or substantially the same as those described in the first and second preferred embodiments. In the present preferred embodiment, there is neither a substrate on which a coil conductor corresponding to the intermediate first coil conductor or the intermediate second coil conductor is provided, nor a substrate on which the intermediate first coil conductor or the intermediate second coil conductor is provided. In a case where the number of turns required for the first coil conductor and the second coil conductor is small, the number of layers of the coil conductor and the number of layers of the substrate may be small as described above. Also in the case of this example, it is preferable that the line width of the input/output terminal side first coil conductor LP1 is thicker than the line width of the common terminal side first coil conductor LC1. In other words, it is preferable that the line width of the common terminal side first coil conductor LC1 is thinner than the line width of the input/output terminal side first coil conductor LP1. Similarly, it is preferable that the line width of the input/output terminal side second coil conductor LP2 is thicker than the line width of the common terminal side second coil conductor LC2. In other words, it is preferable that the line width of the common terminal side second coil conductor LC2 is thinner than the line width of the input/output terminal side second coil conductor LP2. This makes it possible to reduce or prevent the parasitic capacitance of the first coil L1 itself and the parasitic capacitance of the second coil L2 itself while increasing the capacitance between the input and output of the first coil L1 and the second coil L2.

Fourth Preferred Embodiment

In a fourth preferred embodiment of the present invention, an example of a coil device including an impedance matching circuit will be described.

Figure 10:
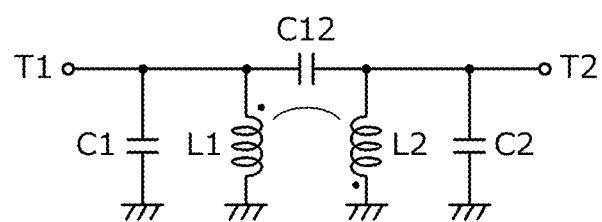
FIG. 10 is a circuit diagram of a coil device 14 according to a fourth preferred embodiment of the present invention.

FIG. 10 is a circuit diagram of a coil device 14 according to the fourth preferred embodiment. The coil device 14 includes the first coil L1, the second coil L2, a first capacitor C1, a second capacitor C2, and the input-output capacitor C12.

The first coil L1 and the second coil L2 define a transformer while being magnetically coupled to each other.

The first capacitor C1 is connected in parallel to the first coil L1, and the second capacitor C2 is connected in parallel to the second coil L2. Accordingly, the first capacitor C1 and the second capacitor C2 act as an impedance matching circuit of an input/output unit of the coil device 14.

The configuration of the first coil conductor pattern and the second coil conductor pattern is the same or substantially the same as the configuration described in the first preferred embodiment, the second preferred embodiment, and the third preferred embodiment.

The first capacitor C1 is defined by a capacitance that is parasitically generated between the layers of the first coil conductor pattern and between the lines. Similarly, the second capacitor C2 is defined by a capacitance that is parasitically generated between the layers of the second coil conductor pattern and between the lines.

Fifth Preferred Embodiment

In a fifth preferred embodiment of the present invention, an example of a phase shift circuit will be described.

Figure 11A:
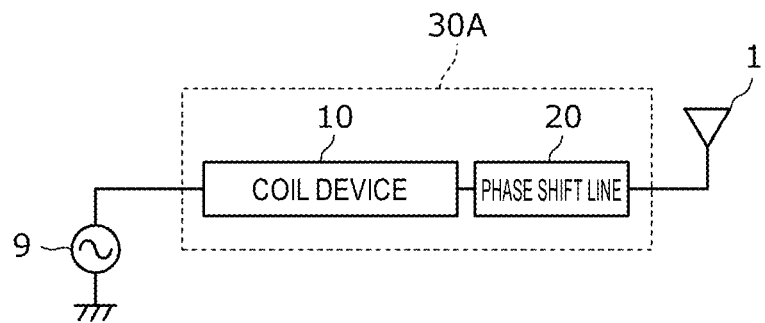
FIGS. 11A and 11B are block diagrams illustrating configurations of phase shift circuits 30A and 30B according to a fifth preferred embodiment of the present invention.
Figure 11B:
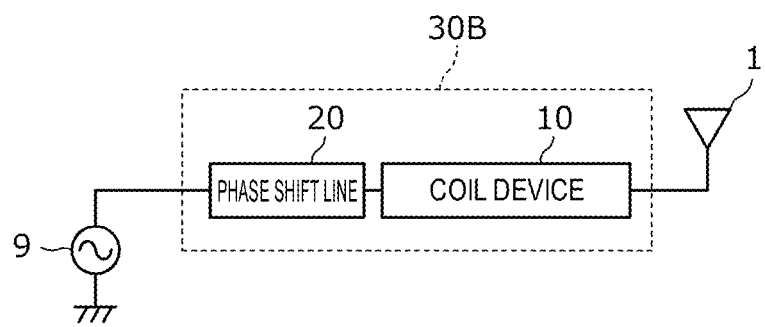

FIGS. 11A and 11B are block diagrams illustrating configurations of phase shift circuits 30A and 30B according to the fifth preferred embodiment. The phase shift circuits 30A and 30B are connected between a feed circuit 9 and an antenna 1. The phase shift circuit 30A includes a coil device 10 and a phase shift line 20 connected in series to the coil device 10. Further, the phase shift circuit 30B includes the phase shift line 20 and the coil device 10 connected in series to the phase shift line 20. The basic configuration of the coil device 10 is the same or substantially the same as that of each of the coil devices 11 to 14 described in each of the first to fourth preferred embodiments. The phase shift line 20 is a phase shift line having an amount of phase shift of less than about 90°, for example.

The phase shift circuits 30A and 30B have a phase difference between the input and output terminals by a phase angle obtained by adding the amount of phase shift by the coil device 10 and the amount of phase shift by the phase shift line 20.

As described above, by adding the phase shift line 20, it is possible to perform a phase shift of significantly over 180°, and the total amount of phase shift can be finely adjusted by the amount of phase shift by the coil device 10.

Alternatively, the phase shift line 20 may be integrally provided in the coil device 10, and the phase shift circuits 30A and 30B each may be a single component. Additionally, in FIGS. 11A and 11B, an antenna matching circuit may be provided between the phase shift circuit 30A and the antenna 1 and between the phase shift circuit 30B and the antenna 1. Further, the phase shift line 20 may set the amount of phase shift by determining an electric length of a transmission line (for example, 50Ω line), or may adjust the amount of phase shift by adding a lumped parameter element such as an inductor, a capacitor, or the like, or an LC circuit.

Sixth Preferred Embodiment

Figure 12:
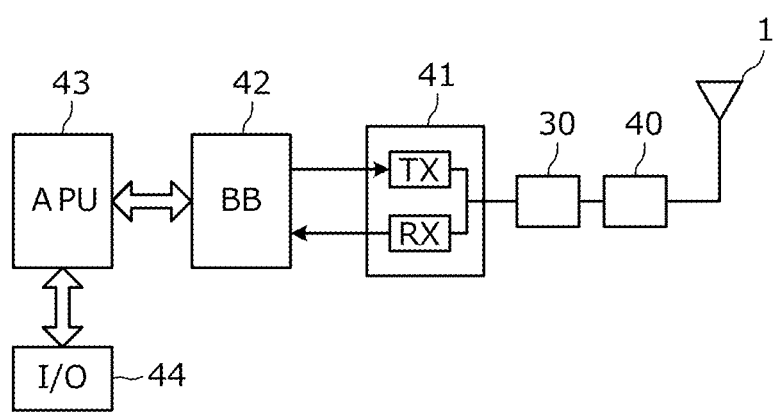
FIG. 12 is a block diagram of a communication apparatus 200 according to a sixth preferred embodiment of the present invention.

In a sixth preferred embodiment of the present invention, an example of a communication apparatus will be described. FIG. 12 is a block diagram of a communication apparatus 200 according to the sixth preferred embodiment. The communication apparatus 200 according to the present preferred embodiment includes the antenna 1, an antenna matching circuit 40, a phase shift circuit 30, a communication circuit 41, a baseband circuit 42, an application processor (APU) 43, and an input/output circuit 44. The communication circuit 41 includes a transmission circuit TX and a reception circuit RX for a low band (about 700 MHz to about 1.0 GHz, for example) and a high band (about 1.4 GHz to about 2.7 GHz, for example), and further includes an antenna duplexer. The antenna 1 is a monopole antenna or an inverted-F antenna corresponding to the low band and the high band. The communication circuit 41 corresponds to a "transmission/reception circuit".

The above-described components are housed in one housing. For example, the antenna matching circuit 40, the phase shift circuit 30, the communication circuit 41, the baseband circuit 42, and the application processor 43 are mounted in or on a printed wiring board, and the printed wiring board is housed in the housing. The input/output circuit 44 is incorporated in the housing as a display/touch panel. The antenna 1 is mounted in or on the printed wiring board or provided on an inner surface or inside of the housing.

The phase shift circuit 30 does not affect the matching in the high band, and can easily obtain antenna matching by the antenna matching circuit 40 by causing a large phase shift of a low-band signal. This makes it possible to obtain a communication apparatus including an antenna matching over a wide band.

Note that, as illustrated in FIG. 12, the phase shift circuit 30 may be applied to, for example, one line of the low band (about 700 MHz to about 1.0 GHz, for example) and the high band (about 1.4 GHz to about 2.7 GHz, for example), other than the configuration in which the phase shift circuit 30 is inserted into a multi-band communication signal path.

Seventh Preferred Embodiment

Figure 13:
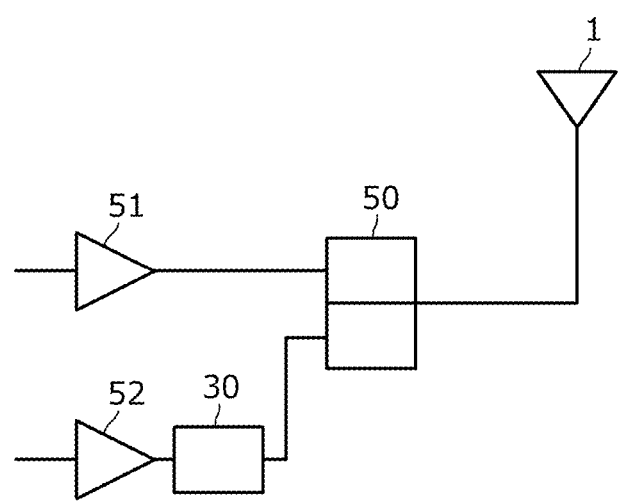
FIG. 13 is a circuit diagram of a portion of a communication apparatus according to a seventh preferred embodiment of the present invention.

In a seventh preferred embodiment of the present invention, another example of the communication apparatus will be described. FIG. 13 is a circuit diagram of a portion of the communication apparatus according to the seventh preferred embodiment. The communication apparatus according to the present preferred embodiment includes the antenna 1, a diplexer 50, high-frequency power amplifier circuits 51 and 52, and the phase shift circuit 30. A high-band transmission circuit is connected to an input unit of the high-frequency power amplifier circuit 51, and a low-band transmission circuit is connected to an input unit of the high-frequency power amplifier circuit 52. The high-frequency power amplifier circuits 51 and 52 correspond to a "transmission/reception circuit".

The phase shift circuit 30 shifts only the amount of phase shift at which an output end of the high-frequency power amplifier circuit 52 appears to be equivalently open from an output end of the high-frequency power amplifier circuit 51 or the output end of the high-frequency power amplifier circuit 51 appears to be equivalently open from the output end of the high-frequency power amplifier circuit 52.

In this way, it is possible to ensure isolation between the high-frequency power amplifier circuit 51 and the high-frequency power amplifier circuit 52.

Finally, the description of the preferred embodiments described above is illustrative in all respects and is not restrictive. Modifications and changes can be appropriately made by those skilled in the art. The scope of the present invention is indicated by the appended claims rather than by the foregoing preferred embodiments. Further, the scope of the present invention includes changes from the preferred embodiments within the scope and equivalent of the claims of the present invention.

For example, in the above-described preferred embodiments, the example in which the conductor pattern defining the first coil conductor and the conductor pattern defining the second coil conductor are in a line-symmetric relationship with each other has been described, but the symmetry is not essential.

Further, the winding axis of the first coil conductor (first winding axis) and the winding axis of the second coil conductor (second winding axis) need not necessarily coincide with each other, as long as the relationship is established in which the "first winding axis" and the "second winding axis" are parallel or substantially parallel to each other, the input/output terminal side first coil conductor is located between two second coil conductors in the direction of the second winding axis and overlaps the two second coil conductors when viewed in the direction of the second winding axis, and the input/output terminal side second coil conductor is located between two first coil conductors in the direction of the first winding axis and overlaps the two first coil conductors when viewed in the direction of the first winding axis.

Further, in each of the preferred embodiments described above, the example in which the inductance ratio between the first coil L1 and the second coil L2 is about 1:1 has been described, but the inductance ratio may be other than the above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil device comprising:
   an insulating substrate; and
   a first input/output terminal, a second input/output terminal, a common terminal, a first coil, and a second coil, each of which is provided on the insulating substrate; wherein
   the first coil includes a first coil conductor with a shape wound around a first winding axis;
   the second coil includes a second coil conductor with a shape wound around a second winding axis parallel or substantially parallel to a direction of the first winding axis;
   the first coil includes a plurality of first coil conductors provided over a plurality of layers, the plurality of first coil conductors including an input/output terminal side first coil conductor with one end connected to an input/output terminal;
   the second coil includes a plurality of second coil conductors provided over a plurality of layers, the plurality of second coil conductors including an input/output terminal side second coil conductor having one end connected to an input/output terminal;
   the input/output terminal side first coil conductor is located between two second coil conductors among the plurality of second coil conductors in a direction of the second winding axis, and overlaps the two second coil conductors when viewed in a direction of the second winding axis;
   one of the two second coil conductors is the input/output terminal side second coil conductor;
   the input/output terminal side second coil conductor is between two first coil conductors among the plurality of first coil conductors in a direction of the first winding axis, and overlaps the two first coil conductors when viewed in a direction of the first winding axis; and
   one of the two first coil conductors is the input/output terminal side first coil conductor.

2. The coil device according to claim 1, wherein
another one of the two first coil conductors, which is different from the input/output terminal side first coil conductor, is a common terminal side first coil conductor with one end connected to the common terminal; and
another one of the two second coil conductors, which is different from the input/output terminal side second coil conductor, is a common terminal side second coil conductor with one end connected to the common terminal.

3. The coil device according to claim 2, wherein
a line width of the input/output terminal side first coil conductor includes a portion thicker than a line width of the common terminal side first coil conductor; and
a line width of the input/output terminal side second coil conductor includes a portion thicker than a line width of the common terminal side second coil conductor.

4. The coil device according to claim 2, wherein
a number of turns of the input/output terminal side first coil conductor is greater than a number of turns of the common terminal side first coil conductor; and
a number of turns of the input/output terminal side second coil conductor is greater than a number of turns of the common terminal side second coil conductor.

5. The coil device according to claim 1, wherein
the plurality of first coil conductors include a common terminal side first coil conductor with one end connected to the common terminal, and an intermediate first coil conductor sandwiched between the input/output terminal side first coil conductor and the common terminal side first coil conductor in a direction of the first winding axis;
another one of the two first coil conductors, which is different from the input/output terminal side first coil conductor, is the intermediate first coil conductor;
the plurality of second coil conductors include a common terminal side second coil conductor with one end connected to the common terminal, and an intermediate second coil conductor sandwiched between the input/output terminal side second coil conductor and the common terminal side second coil conductor in a direction of the second winding axis; and
another one of the two second coil conductors, which is different from the input/output terminal side second coil conductor, is the intermediate second coil conductor.

6. The coil device according to claim 1, wherein
a number of turns of the input/output terminal side first coil conductor is greater than 1;
an interlayer connection conductor connected to the input/output terminal side first coil conductor is positioned in a coil opening of the input/output terminal side second coil conductor;
a number of turns of the input/output terminal side second coil conductor is greater than 1; and
an interlayer connection conductor connected to the input/output terminal side second coil conductor is positioned in a coil opening of the input/output terminal side first coil conductor.

7. A phase shift circuit comprising:
the coil device according to claim 1; and
a phase shift line connected in series to the coil device and having an amount of phase shift of less than about 90°.

8. A communication apparatus comprising:
a transmission/reception circuit; and
an antenna connected to the transmission/reception circuit; wherein
the communication apparatus includes the phase shift circuit according to claim 7 between the transmission/reception circuit and the antenna.

9. A communication apparatus comprising:
a transmission/reception circuit; and
a diplexer connected to the transmission/reception circuit; wherein
the communication apparatus includes the phase shift circuit according to claim 7 between the transmission/reception circuit and the diplexer.

10. The phase shift circuit according to claim 7, wherein
another one of the two first coil conductors, which is different from the input/output terminal side first coil conductor, is a common terminal side first coil conductor with one end connected to the common terminal; and
another one of the two second coil conductors, which is different from the input/output terminal side second coil conductor, is a common terminal side second coil conductor with one end connected to the common terminal.

11. The phase shift circuit according to claim 10, wherein
a line width of the input/output terminal side first coil conductor includes a portion thicker than a line width of the common terminal side first coil conductor; and
a line width of the input/output terminal side second coil conductor includes a portion thicker than a line width of the common terminal side second coil conductor.

12. The phase shift circuit according to claim 10, wherein
a number of turns of the input/output terminal side first coil conductor is greater than a number of turns of the common terminal side first coil conductor; and
a number of turns of the input/output terminal side second coil conductor is greater than a number of turns of the common terminal side second coil conductor.

13. The phase shift circuit according to claim 7, wherein
the plurality of first coil conductors include a common terminal side first coil conductor with one end connected to the common terminal, and an intermediate first coil conductor sandwiched between the input/output terminal side first coil conductor and the common terminal side first coil conductor in a direction of the first winding axis;
another one of the two first coil conductors, which is different from the input/output terminal side first coil conductor, is the intermediate first coil conductor;
the plurality of second coil conductors include a common terminal side second coil conductor with one end connected to the common terminal, and an intermediate second coil conductor sandwiched between the input/output terminal side second coil conductor and the common terminal side second coil conductor in a direction of the second winding axis; and
another one of the two second coil conductors, which is different from the input/output terminal side second coil conductor, is the intermediate second coil conductor.

14. The phase shift circuit according to claim 7, wherein
a number of turns of the input/output terminal side first coil conductor is greater than 1;
an interlayer connection conductor connected to the input/output terminal side first coil conductor is positioned in a coil opening of the input/output terminal side second coil conductor;

a number of turns of the input/output terminal side second coil conductor is greater than 1; and an interlayer connection conductor connected to the input/output terminal side second coil conductor is positioned in a coil opening of the input/output terminal side first coil conductor.

15. A communication apparatus comprising:
a transmission/reception circuit; and
an antenna connected to the transmission/reception circuit; wherein
the communication apparatus includes the coil device according to claim 1 between the transmission/reception circuit and the antenna.

16. The communication apparatus according to claim 15, wherein
another one of the two first coil conductors, which is different from the input/output terminal side first coil conductor, is a common terminal side first coil conductor with one end connected to the common terminal; and
another one of the two second coil conductors, which is different from the input/output terminal side second coil conductor, is a common terminal side second coil conductor with one end connected to the common terminal.

17. The communication apparatus according to claim 15, wherein
the plurality of first coil conductors include a common terminal side first coil conductor with one end connected to the common terminal, and an intermediate first coil conductor sandwiched between the input/output terminal side first coil conductor and the common terminal side first coil conductor in a direction of the first winding axis;
another one of the two first coil conductors, which is different from the input/output terminal side first coil conductor, is the intermediate first coil conductor;
the plurality of second coil conductors include a common terminal side second coil conductor with one end connected to the common terminal, and an intermediate second coil conductor sandwiched between the input/output terminal side second coil conductor and the common terminal side second coil conductor in a direction of the second winding axis; and
another one of the two second coil conductors, which is different from the input/output terminal side second coil conductor, is the intermediate second coil conductor.

18. A communication apparatus comprising:
a transmission/reception circuit; and
a diplexer connected to the transmission/reception circuit; wherein
the communication apparatus includes the coil device according to claim 1 between the transmission/reception circuit and the diplexer.

19. The communication apparatus according to claim 18, wherein
another one of the two first coil conductors, which is different from the input/output terminal side first coil conductor, is a common terminal side first coil conductor with one end connected to the common terminal; and
another one of the two second coil conductors, which is different from the input/output terminal side second coil conductor, is a common terminal side second coil conductor with one end connected to the common terminal.

20. The communication apparatus according to claim 18, wherein
the plurality of first coil conductors include a common terminal side first coil conductor with one end connected to the common terminal, and an intermediate first coil conductor sandwiched between the input/output terminal side first coil conductor and the common terminal side first coil conductor in a direction of the first winding axis;
another one of the two first coil conductors, which is different from the input/output terminal side first coil conductor, is the intermediate first coil conductor;
the plurality of second coil conductors include a common terminal side second coil conductor with one end connected to the common terminal, and an intermediate second coil conductor sandwiched between the input/output terminal side second coil conductor and the common terminal side second coil conductor in a direction of the second winding axis; and
another one of the two second coil conductors, which is different from the input/output terminal side second coil conductor, is the intermediate second coil conductor.

* * * * *